US006668570B2

(12) United States Patent
Wall et al.

(10) Patent No.: US 6,668,570 B2
(45) Date of Patent: Dec. 30, 2003

(54) APPARATUS AND METHOD FOR CONTROLLING THE TEMPERATURE OF AN ELECTRONIC DEVICE UNDER TEST (75) Inventors: Charles B. Wall, Lexington, SC (US); Cynthia M. Barnes, Columbia, SC (US)

(73) Assignee: Kryotech, Inc., West Columbia, SC (US)

(*) Notice: Subject to any disclaimer, the term of this patent is extended or adjusted under 35 U.S.C. 154(b) by 0 days.

(21) Appl. No.: 09/871,526

(22) Filed: May 31, 2001

(65) Prior Publication Data

US 2003/0217558 A1 Nov. 27, 2003

(51) Int. Cl.[7] ................................................ F25B 41/04
(52) U.S. Cl. ........................ 62/223; 62/211; 165/80.2; 165/255
(58) Field of Search .......................... 62/210, 211, 212, 62/222, 223, 224, 225, 230, 259.2; 165/253, 254, 255, 259, 80.2; 324/760

(56) References Cited

U.S. PATENT DOCUMENTS

| | | | |
|---|---|---|---|
| 3,003,332 A | 10/1961 | Watkins | ..................... 62/224 X |
| 3,757,530 A | 9/1973 | Doyle et al. | .............. 62/225 X |
| 3,882,691 A | 5/1975 | Baines et al. | .................. 62/225 |
| 4,807,445 A | 2/1989 | Matsuoka et al. | ............. 62/212 |
| 5,125,451 A | 6/1992 | Matthews | .................. 165/80.4 |
| 5,164,661 A | 11/1992 | Jones | ..................... 324/158 F |
| 5,196,785 A | 3/1993 | Douglas | ................. 324/158 F |
| 5,198,753 A | 3/1993 | Hamburgen | |
| 5,271,239 A | 12/1993 | Rockenfeller et al. | |
| 5,325,052 A | 6/1994 | Yamashita | |
| 5,365,749 A | 11/1994 | Porter | |
| 5,574,627 A | 11/1996 | Porter | |
| 5,587,880 A | 12/1996 | Phillips et al. | |
| 5,821,505 A | 10/1998 | Tustaniwskyj et al. | |
| 5,847,293 A | 12/1998 | Jones | |
| 5,847,366 A | 12/1998 | Grunfeld | ..................... 219/497 |
| 5,918,469 A | 7/1999 | Cardella | ........................ 62/3.7 |
| 5,944,093 A | 8/1999 | Viswanath | ............. 165/104.26 |
| 5,977,785 A | 11/1999 | Burward-Hoy | ............. 324/760 |
| 6,049,217 A | 4/2000 | Viswanath et al. | ......... 324/760 |
| 6,054,676 A | 4/2000 | Wall et al. | |
| 6,084,215 A | 7/2000 | Furuya et al. | |
| 6,104,204 A | 8/2000 | Hayama et al. | |
| 6,147,506 A | 11/2000 | Ahmad et al. | |
| 6,163,163 A | 12/2000 | Kohn et al. | |
| 6,184,504 B1 | 2/2001 | Cardella | |
| 6,246,581 B1 | 6/2001 | Kang et al. | |
| 6,262,584 B1 | 7/2001 | Kurosu et al. | |
| 6,297,660 B2 | 10/2001 | Farnworth et al. | .......... 324/765 |
| 6,476,627 B1 | 11/2002 | Pelissier et al. | ............. 324/760 |
| 6,489,793 B2 | 12/2002 | Jones et al. | .................. 324/760 |

FOREIGN PATENT DOCUMENTS

| | | |
|---|---|---|
| EP | 0994645 | 4/2000 |
| WO | 9846059 | 10/1998 |

OTHER PUBLICATIONS

PCT International Search Report dated Oct. 25, 2002, 4 pages.

*Primary Examiner*—Harry B. Tanner
(74) *Attorney, Agent, or Firm*—Nelson Mullins Riley & Scarborough (57) ABSTRACT

An apparatus for controlling the temperature of an electronic device under test includes a thermal head having a temperature controlled surface for making thermal contact with the electronic device. The thermal head defines a flow channel for passage of a refrigerant fluid so as to cause transfer of thermal energy between the electronic device and the thermal head. A refrigeration system is connected in fluid communication with the flow channel of the thermal head to supply refrigerant fluid thereto. The refrigeration system includes a metering valve operative to regulate introduction of the refrigerant fluid into the thermal head. A controller is operative to control the metering valve for maintaining a predetermined temperature at the temperature controlled surface.

24 Claims, 6 Drawing Sheets

APPARATUS AND METHOD FOR CONTROLLING THE TEMPERATURE OF AN ELECTRONIC DEVICE UNDER TEST

BACKGROUND OF THE INVENTION

The present invention generally relates to temperature control systems for maintaining the temperature of an electronic device at a predetermined temperature while the device is being tested.

Testing equipment has been utilized in the electronics industry to test the operation of integrated circuits and other electronic devices maintained at a predetermined temperature. Generally, the testing equipment will include a thermal head having a temperature controlled surface for contacting the electronic device being tested. The thermal head is simultaneously heated and cooled in an attempt to maintain the predetermined temperature. The test equipment users (i.e., electronic device manufacturers) generally specify that the thermal head be capable of maintaining the predetermined temperature under all conditions with a variance of ±3° C.

With some such testing equipment, the predetermined temperature can be varied at the option of the technician conducting the testing procedure. Thus, electronic devices can be tested at multiple temperatures to simulate a wide variety of operating conditions. In order to produce the desired temperature at the thermal head, these devices have circulated a chilled liquid, such as water or ethylene glycol, through the thermal head. The liquid itself is chilled in a heat exchanger including the evaporator of a separate refrigeration system. In other words, the evaporator is cooled by the refrigeration system, which then serves to chill the circulating liquid. Heat may be added by heating elements incorporated into the thermal head when necessary to maintain the predetermined temperature.

This prior art technique of using a separate liquid loop presents a number of significant disadvantages. For example, additional maintenance requirements are contributed by the presence of the liquid loop. Moreover, the entire "cool side" of the liquid loop will often be below dew point, thus requiring extensive insulation. Often, it takes systems utilizing a liquid loop up to an hour to reach the desired temperature before testing can begin. The liquid loop also increases the size and power consumption requirements of the testing system.

SUMMARY OF THE INVENTION

In one aspect, the present invention provides an apparatus for controlling the temperature of an electronic device under test. The apparatus comprises a thermal head having a temperature controlled surface for making thermal contact with the electronic device. The thermal head defines a flow channel for passage of a refrigerant fluid so as to cause transfer of thermal energy between the electronic device and the thermal head.

The apparatus further includes a refrigeration system in fluid communication with the flow channel of the thermal head to supply refrigerant fluid thereto. The refrigeration system includes a metering valve operative to regulate flow of the refrigerant fluid. The metering valve is located operatively adjacent the flow channel of the thermal head so as to regulate introduction of refrigerant fluid into the thermal head. A controller is operative to control the metering valve for maintaining a predetermined temperature at the temperature controlled surface.

In some exemplary embodiments, the refrigeration system includes a capillary tube having a first end and a second end. The second end of the capillary tube is connected to be in fluid communication with an inlet of the flow channel of the thermal head. The metering valve in such embodiments may be located at the first end of the capillary tube.

The controller is preferably adapted to allow the predetermined temperature to be varied by a user. In this regard, the metering valve may be a pulsing valve operated by a pulse width modulated (PWM) signal. For example, the pulsing valve is preferably actuated at least once per second. The controller itself may be a PID controller.

It will often be desirable to equip the thermal head with at least one heater device also controlled by the controller. For example, the thermal head may be equipped with a plurality of cartridge heaters.

Other aspects of the present invention are provided by an apparatus for controlling the temperature of an electronic device under test. The apparatus comprises a refrigeration system including a compressor and a condenser. The refrigeration system is operative to circulate a refrigerant fluid through a fluid flow loop such that the refrigerant fluid will change between gaseous and liquid states so as to alternately absorb and release thermal energy.

The apparatus further includes a thermal head having a temperature controlled surface. The thermal head defines a flow channel for passage of the refrigerant fluid to thereby function as an evaporator in the refrigeration system. A metering valve is located operatively adjacent the evaporator in the fluid flow loop. The metering valve is operative to regulate introduction of refrigerant fluid into the flow channel of the thermal head for maintaining a predetermined temperature at the temperature controlled surface.

Still further aspects of the present invention are provided by an apparatus for controlling the temperature of an electronic device under test. The apparatus comprises a refrigeration system including a compressor and a condenser. The refrigeration system is operative to circulate a refrigerant fluid through a fluid flow loop such that the refrigerant fluid will change between gaseous and liquid states so as to alternately absorb and release thermal energy.

The apparatus further includes a thermal head having a temperature controlled surface. The thermal head defines a flow channel for passage of the refrigerant fluid to thereby function as an evaporator in the refrigeration system. At least one heater device is operative to supply thermal energy to the thermal head.

A metering valve is adjacent the evaporator in the fluid flow loop. The metering valve is operative to regulate introduction of refrigerant fluid into the flow channel of the thermal head. A controller is operative to control the metering valve and the heater device for maintaining a predetermined temperature at the temperature controlled surface.

Additional aspects of the present invention are provided by a method of maintaining an electronic device under test at a predetermined temperature. One step of the method involves providing a thermal head having both cooling capability and heating capability, the thermal head including a temperature controlled surface in thermal contact with the electronic device. A rate of change of instantaneous power consumption by the electronic device is then determined and compared with a predetermined threshold. If the rate of change exceeds the threshold in a manner indicating that instantaneous power consumption is decreasing, the heating capability of the thermal head is selectively activated. If said rate of change exceeds the threshold in a manner indicating that instantaneous power consumption is increasing, the cooling capability of the thermal head is selectively activated. For example, the cooling and heating capability may be selectively activated by being activated at full operation for a predetermined period of time.

Still further aspects of the present invention are provided by a refrigeration apparatus operative to circulate a refrigerant fluid through a fluid flow loop such that the refrigerant fluid will change between gaseous and liquid states so as to alternately absorb and release thermal energy. The refrigeration apparatus comprises a compressor operative to increase pressure of the refrigerant fluid in the gaseous state. A condenser is also provided, where the refrigerant fluid releases thermal energy while passing therethrough and changes to a liquid state. The refrigerant fluid absorbs thermal energy while passing through an evaporator to thereby change to a gaseous state.

A metering valve is located operatively adjacent the evaporator in the fluid flow loop. The metering valve is operative to regulate introduction of refrigerant fluid into the evaporator. A controller is operative to control the metering valve for maintaining a predetermined temperature at the evaporator.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only and is not intended as limiting the broader aspects of the present invention, which broader aspects are embodied in the exemplary constructions.

Figure 1:
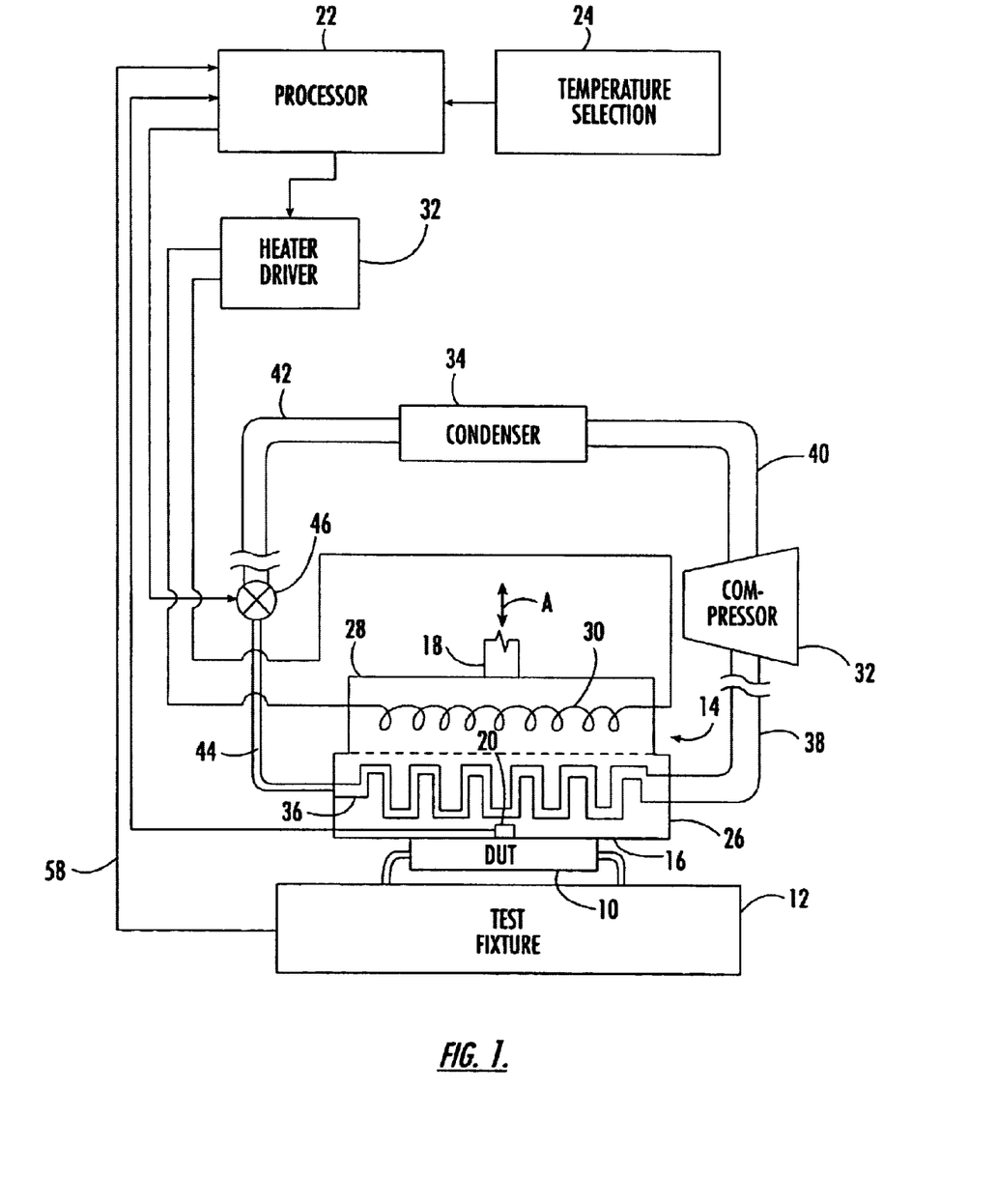
FIG. 1 is a diagrammatic representation of an apparatus constructed in accordance with the present invention for controlling the temperature of an electronic device under test.

FIG. 1 illustrates an apparatus for controlling the temperature of an electronic device 10 under test ("DUT"). In this case, device 10 is an integrated circuit device mounted in a suitable test fixture 12. Test fixture 12 supplies the energy to power device 10, as well as the various read/write commands by which the performance of device 10 is evaluated.

A thermal head 14 has a temperature controlled surface 16 in thermal contact with device 10. In this case, thermal head 14 is attached to the end of a movable rod 18 which operates to move temperature controlled surface 16 into and out of engagement with device 10 (as indicated by arrow A). For example, rod 18 may form the piston rod of a pneumatic cylinder which is actuated to position thermal head 14 adjacent the device to be tested.

As shown, a thermocouple 20 or other suitable sensor is provided at temperature controlled surface 16 to detect the temperature of device 10. This information is fed to a processor 22 for controlling the operation of thermal head 14 so as to maintain a predetermined temperature. For example, the temperature to be maintained is entered by a user at temperature selector 24. One skilled in the art will recognize that the functions of processor 22 and temperature selector 24 may be performed by a single digital computer or the like.

Thermal head 14 is preferably configured having both cooling and heating capability to accurately maintain a wide range of possible temperatures. In this case, for example, thermal head 14 has a cooled portion 26 situated between temperature controlled surface 16 and a heated portion 28. Heated portion 28 includes one or more heating elements 30 operative to supply thermal energy when the temperature of device 10 drops below the desired temperature. A suitable driver 32 is controlled by processor 22 so as to supply the requisite power to operate heating element 30.

Cooled portion 26 of thermal head 14 forms the evaporator of a refrigeration system also including a compressor 32 and a condenser 34. The refrigeration system employs a refrigerant fluid, such as R134a, circulated so as to alternately absorb and release thermal energy. This occurs when the refrigerant fluid changes between gaseous and liquid states in accordance with the well-known refrigeration cycle.

In particular, the refrigerant fluid absorbs excess thermal energy at the location of device 10 when refrigerant fluid "evaporates" from a liquid state to a gaseous state. This evaporation occurs in a fluid flow channel 36 defined in thermal head 14. The low pressure gas exiting thermal head 14 is then fed along pipe 38 to compressor 32. The resulting high pressure gas is fed to condenser 34 by pipe 40, where accumulated thermal energy dissipates. As a result, the refrigerant fluid is condensed to liquid form.

High pressure liquid from condenser 34 is fed back toward thermal head 14 along pipe 42 and capillary tube 44. An "expansion valve" is formed in this case by the interface of capillary tube 44 and fluid flow channel 36. Specifically, the refrigerant in liquid form undergoes a pressure drop as it leaves the small inner diameter of capillary tube 44 and enters the larger enclosed volume at the inlet of flow channel 36. This pressure drop causes a reduction in temperature as predicted by the ideal gas law.

The apparatus shown in FIG. 1 is operative to maintain the selected temperature at temperature controlled surface 16 with high accuracy. In general, this temperature can be easily controlled over a specified range within the ±3° C. requirement. For example, the apparatus is capable of operating over a specified range between −100° C. to +200° C. with an accuracy of ±0.5° C. in presently preferred embodiments.

To tightly control the selected temperature, a metering valve 46 is located operatively adjacent to thermal head 14 so as to regulate flow of refrigerant fluid into flow channel 36. Although the use of various proportional valves is contemplated, the illustrated embodiment utilizes a normally closed solenoid pulsing valve controlled by a pulse width modulated (PWM) signal. The duty cycle of the PWM signal is chosen by processor 22 so as to maintain the desired temperature.

Preferably, metering valve 46 may be located within 18 inches of the inlet to flow channel 36 so as to regulate flow of refrigerant fluid thereto without substantial lag times. In the illustrated embodiment, for example, metering valve 46 may be located at the inlet to capillary tube 44. Often, capillary tube 44 will have a length of no more than about 12 inches. The relatively short length and small inner diameter of capillary tube 44 ensures a quick reaction time between operation of valve 44 and the temperature at temperature controlled surface 16.

Kryotech, Inc., the assignee of the present invention, has previously developed testing equipment in which the thermal head is configured as an evaporator in a refrigeration system. Refrigerant fluid passes to the thermal head in liquid form, where it is expanded. The resulting temperature drop absorbs thermal energy for the electronic device being tested so as to maintain a predetermined temperature. One such system utilized a valve adjacent the outlet of the condenser operating under the control of a proportional controller. As in many embodiments of the present invention, the compressor and condenser were located several feet (e.g., 4–5 feet) away from the thermal head in the flow loop of the refrigerant fluid. In part because of the distant location of the valve, this system was capable of controlling the selected temperature only to an accuracy of about ±10° C.

Figure 2:
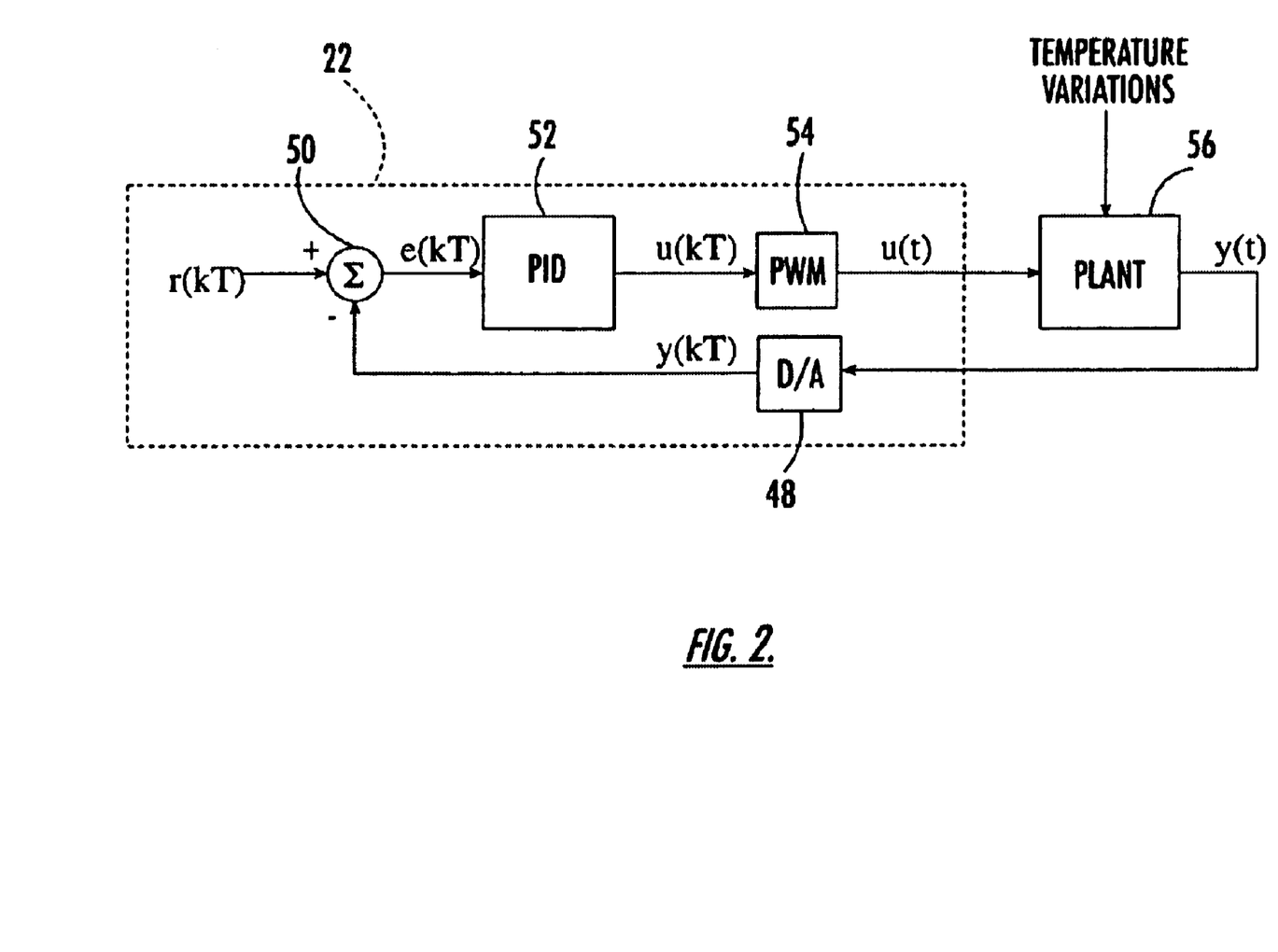
FIG. 2 is a block diagram illustrating the manner in which the apparatus of FIG. 1 functions as a closed loop system to maintain a predetermined temperature.

An overall diagram of the closed loop control system provided by the apparatus of FIG. 1 is shown in FIG. 2. In this case, the control system is depicted as a digital control system, although one skilled in the art will recognize that various analog systems can also be constructed in accordance with the present invention. As shown, thermocouple 20 provides a continuous temperature signal y(t) which is sampled and digitized, as indicated at 48, to yield a sampled temperature signal y(kT). Signal y(kT) is then compared with an ideal temperature signal r(kT), as indicated at 50, to produce an error signal e(kT).

As indicated at 52, processor 22 implements a control algorithm on error signal e(kT) to produce a correction signal u(kT). In presently preferred embodiments, the control algorithm may be a proportional plus integral plus derivative (PID) control algorithm as shown. The correction signal u(kT) is pulse width modulated, as indicated at 54, or otherwise transformed to an appropriate analog signal u(t) for operation of the temperature control apparatus (or "plant") 56. For example, the correction signal u(kT) may contain instructions for operation of both the system's cooling and heating capability.

It will be appreciated that the closed loop system shown in FIG. 2 is very effective at maintaining the desired temperature under steady state operating conditions. Preferably, this system will sample the temperature signal and produce a desired correction signal at least once per second. For example, the temperature at surface 16 is sampled at least every 300 ms by this closed loop portion of the control system in presently preferred embodiments.

Due to the low mass of electronic devices, however, they may dramatically change their temperature faster than a purely closed loop system can effectively compensate. Because such a change in temperature will virtually always be due to a change in power consumption (with some slight thermal lag), the instantaneous power consumption of the electronic device can be used to directly predict rapid changes in device temperature. Thus, as shown in FIG. 1, processor 22 preferably receives a signal 58 from test fixture 12 indicating the power consumption of electronic device 10.

Figure 3:
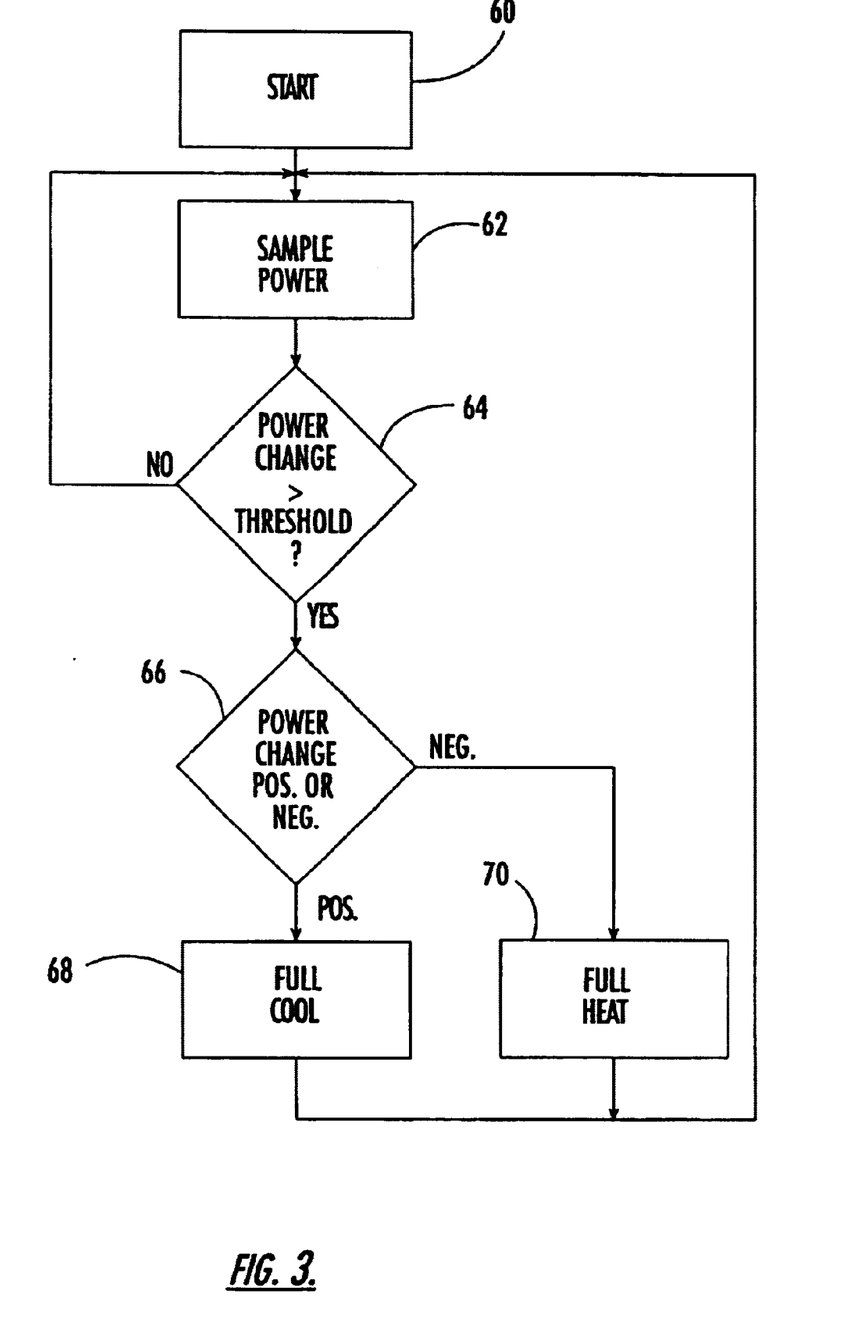
FIG. 3 is a flow diagram showing an additional open loop technique which can be used to further enhance the accuracy of the apparatus of FIG. 1.

FIG. 3 illustrates one manner in which processor 22 may utilize the power signal from test fixture 12. After the process has started (as indicated at 60), the instantaneous power consumption of device 10 is sampled (as indicated at 62). In order to quickly respond to predicted temperature variations, processor 22 preferably samples the power consumption many times per second. For example, the power consumption may be sampled 20–50 times per second or more in accordance with presently preferred embodiments of the present invention.

The rate of change of power consumption (i.e., the first derivative of the power consumption) is then compared against a predetermined threshold (as indicated at 64). If the rate of change does not exceed the threshold, the process loops back for the next sample.

If the rate of power consumption does exceed the predetermined threshold, processor 22 determines whether the power consumption is increasing or decreasing (as indicated at 66). A positive power change indicates that the temperature of the electronic device will be increasing. Similarly, a negative power change indicates that the temperature of the electronic device will be decreasing. Action can be immediately taken to counteract these predicted temperature changes as they are occurring.

For example, the system may be activated into a full cooling mode (as indicated at 68) when the rate of power consumption exceeds the threshold in the positive direction. Full heating mode can be similarly activated (as indicated at 70) when the rate of power consumption exceeds the threshold in the negative direction. Preferably, this open loop control system will maintain full cooling or heating just long enough to counteract the dramatic temperature change. In presently preferred embodiments, for example, the full "on" operation of either heating or cooling is maintained for about 200 milliseconds. The closed loop control system will then continue as usual to maintain the temperature of electronic device 10.

Figure 4:
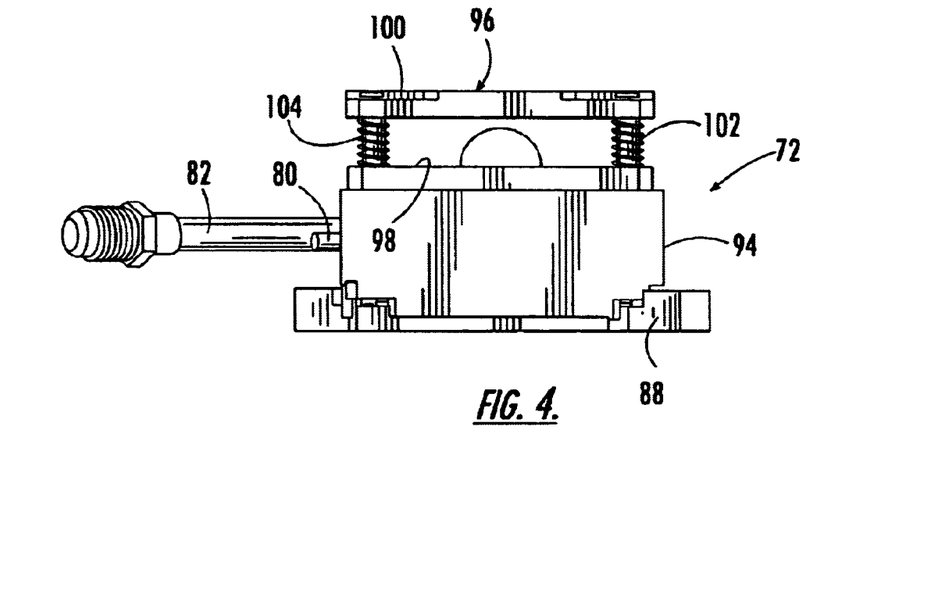
FIG. 4 is a side elevational view of a preferred embodiment of a thermal head assembly which can be utilized with the apparatus of FIG. 1.
Figure 5:
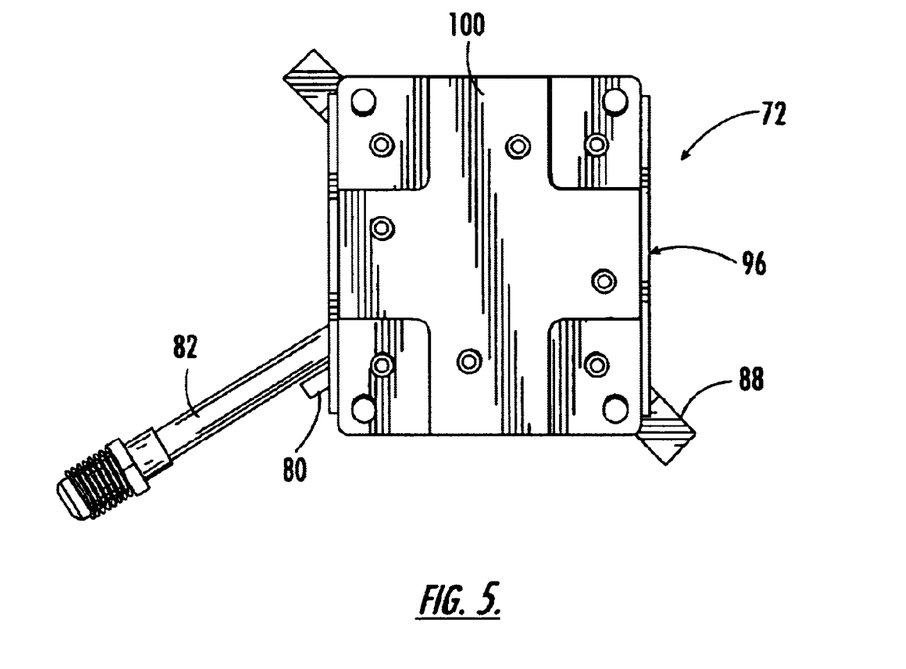
FIG. 5 is a view top plan view of the thermal head assembly of FIG. 4.
Figure 6:
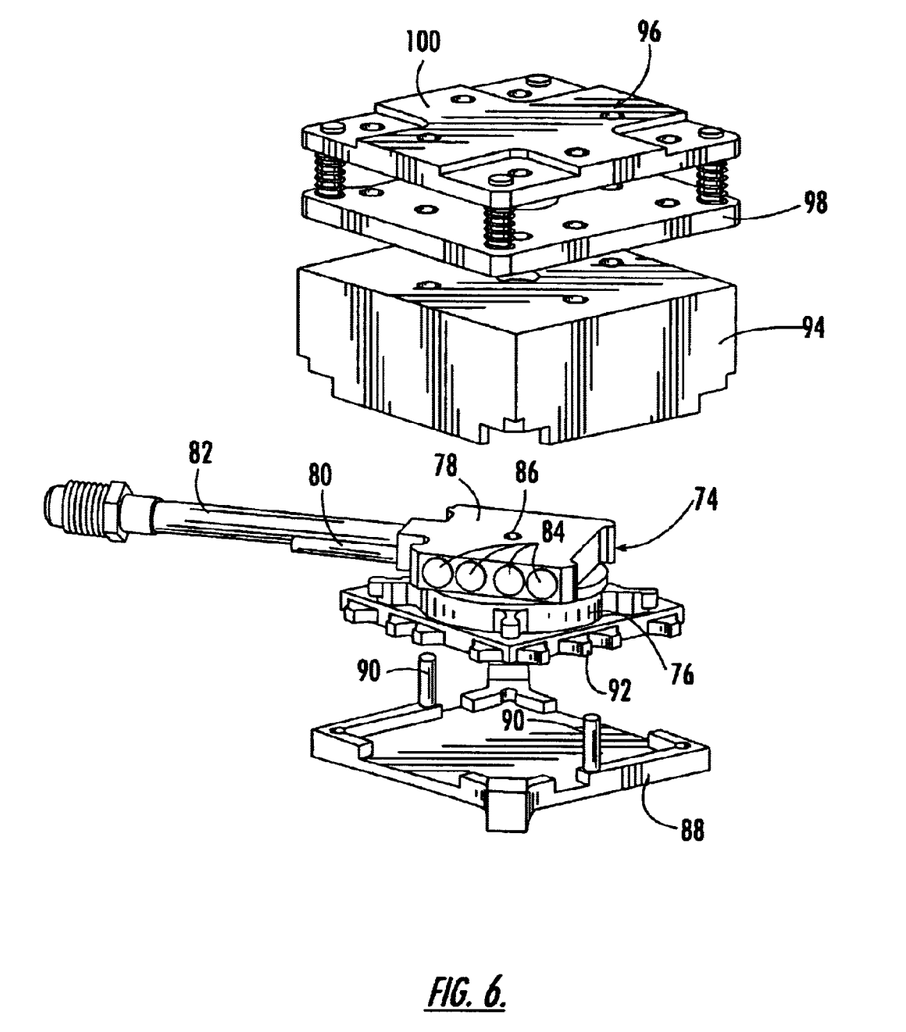
FIG. 6 is an exploded view showing various parts of the thermal head assembly of FIG. 4.

FIGS. 4–6 illustrate a thermal head assembly 72 that may be used with the apparatus of FIG. 1. As shown, assembly 72 includes a thermal head 74 having a cooled portion 76 integrated with a heated portion 78. Refrigerant fluid enters cooled portion 76 through capillary tube 80 and exits via outlet pipe 82. In this case, heated portion 78 defines a plurality of transverse holes 84 in which respective cartridge heaters are inserted. Leads from the thermocouple exit through a central vertical hole 86.

As shown, thermal head 74 may be adapted to mate with the particular configuration of a socket cover 88 (which is part of the test fixture). In this case, for example, socket cover 88 includes a pair of upstanding aligning pins 90. Pins 90 are received in the area between an adjacent pair of ears 92 located on the lower periphery of thermal head 74.

Preferably, thermal head 74 is received in a housing block 94 formed of a suitable insulative material, such as nylon 6/6. A gimbal assembly 96 is attached to housing block 94 to facilitate even mating between thermal head 74 and the device under test. In this case, assembly 96 includes a lower plate 98 and an upper plate 100 interconnected by a plurality of corner posts, such as post 102. Each of the corner posts is surrounded by a helical spring such as spring 104 to normally urge plates 98 and 100 away from one another.

Figure 7:
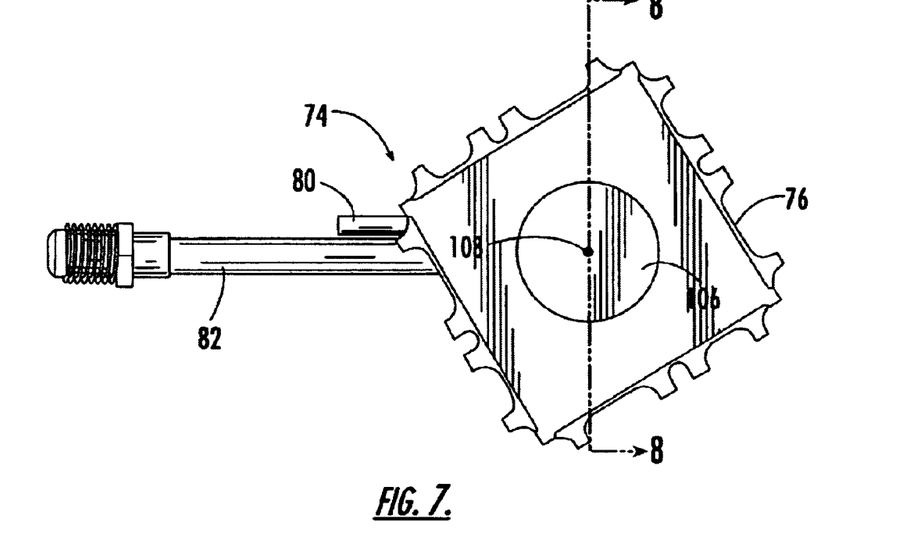
FIG. 7 is a bottom plan view of the thermal head component of the assembly of FIG. 4 showing the temperature controlled surface thereof.

As shown in FIG. 7, a temperature controlled surface 106 is defined on the bottom of thermal head 74. Surface 106 is preferably polished or otherwise configured so as to exhibit exceptional flatness and thus a relatively high reflectivity. The thermocouple is received in a central hole 108 defined as shown in surface 106.

Figure 8:
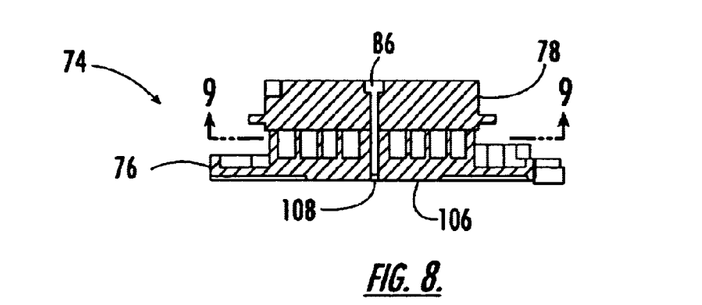
FIG. 8 is a cross sectional view taken along line 8—8 of FIG. 7.

Further details regarding the construction of thermal head 74 can be most easily explained with reference to FIG. 8. As one skilled in the art will appreciate, thermal head 74 is preferably made of materials which exhibit high thermal conductivity. At the same time, thermal head 74 is configured to have low mass in order to allow rapid transfer of thermal energy. In this regard, cooled portion 76 may be formed of copper with heated portion 78 being formed of brass. The two pieces can be joined together such as by brazing to yield an integral structure.

Figure 9:
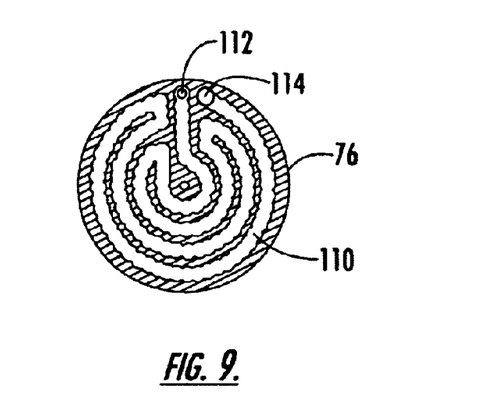
FIG. 9 is a cross sectional view taken along line 9—9 of FIG. 8.

FIG. 9 shows an exemplary flow channel 110 which can be defined in cooled portion 76. In this case, refrigerant fluid enters through inlet 112 and moves along the serpentine pattern of flow channel 110. Absorbed thermal energy causes the refrigerant to evaporate before exiting through outlet 114. In this embodiment, flow channel 110 is formed by individual drilled holes that are connected along the length of the path.

It can be seen that the present invention provides apparatus and methods for maintaining an electronic device under test at a selected temperature. Because the system uses a circulating refrigerant fluid instead of a liquid loop, the various disadvantages of liquid loop systems are eliminated. For example, there is no need for insulation of pipes as is required in a liquid loop system because all of the parts except the evaporator and suction tube back to the compressor remain at ambient temperature. For the same reason, many of the condensation issues presented by liquid loop designs are also eliminated. Set up time and energy efficiency are also improved in comparison with the prior art liquid loop systems.

While preferred embodiments of the invention have been shown and described, modifications and variations may be made thereto by those of skill in the art without departing from the spirit and scope of the present invention. It should also be understood that aspects of various embodiments may be interchanged both in whole or in part. Furthermore, those of ordinary skill in the art will appreciate that the foregoing description is by way of example only, and is not intended to be limitative of the invention so further described in the appended claims.

What is claimed is:

1. An apparatus for controlling the temperature of an electronic device under test, said apparatus comprising:
a thermal head having a temperature controlled surface for making thermal contact with said electronic device;
said thermal head defining a flow channel for passage of a refrigerant fluid so as to cause transfer of thermal energy between said electronic device and said thermal head;
a refrigeration system in fluid communication with said flow channel of said thermal head to supply refrigerant fluid thereto;
said refrigeration system including a metering valve operative to regulate flow of said refrigerant fluid, said metering valve being located operatively adjacent said flow channel of said thermal head so as to regulate introduction of said refrigerant fluid into said thermal head; and
a controller operative to control said metering valve in a pulsing manner so as to maintain a predetermined temperature at said temperature controlled surface.

2. An apparatus as set forth in claim 1, wherein said refrigeration system includes a capillary tube having a first end and a second end, said second end of said capillary tube being in fluid communication with an inlet of said flow channel of said thermal head.

3. An apparatus as set forth in claim 2, wherein said metering valve is located at said first end of said capillary tube.

4. An apparatus as set forth of claim 1, wherein said controller is adapted to allow said predetermined temperature to be varied by a user.

5. An apparatus as set forth in claim 4, wherein said metering valve is a pulsing valve operated by a pulse width modulated (PWM) signal.

6. An apparatus as set forth in claim 4, wherein said pulsing valve is actuated at least once per second.

7. An apparatus as set forth in claim 4, wherein said controller is a PID controller.

8. An apparatus as set forth in claim 1, wherein said thermal head further includes at least one heater device, operation of said heater device also being controlled by said controller.

9. An apparatus as set forth in claim 8, wherein said at least one heater device comprises a plurality of cartridge heaters.

10. An apparatus for controlling the temperature of an electronic device.under test, said apparatus comprising:
a refrigeration system including a compressor and a condenser, said refrigeration system being operative to circulate a refrigerant fluid through a fluid flow loop such that said refrigerant fluid will change between gaseous and liquid states so as to alternately absorb and release thermal energy;
a thermal head having a temperature controlled surface, said thermal head defining a flow channel for passage of said refrigerant fluid to thereby function as an evaporator in said refrigeration system; and
a metering valve located operatively adjacent said evaporator in said fluid flow loop, said metering valve operating in a pulsing manner to regulate introduction of said refrigerant fluid into said flow channel of said thermal head for maintaining a predetermined temperature at said temperature controlled surface.

11. An apparatus as set forth in claim 10, wherein said refrigeration system includes a capillary tube having a first end and a second end, said second end of said capillary tube being in fluid communication with an inlet of said flow channel of said thermal head.

12. An apparatus as set forth in claim 11, wherein said metering valve is located at said first end of said capillary tube.

13. An apparatus as set forth in claim 12, wherein said metering valve is a pulsing valve operated by a pulse width modulated (PWM) signal.

14. An apparatus as set forth in claim 13, further comprising a controller for producing said pulse width modulated (PWM) signal, said controller adapted to allow said predetermined temperature to be varied by a user.

15. An apparatus as set forth in claim 14, wherein said controller is a PID controller.

16. An apparatus as set forth in claim 10, wherein said thermal head further includes at least one heater device operative to supply thermal energy to said temperature controlled surface when necessary to maintain said predetermined temperature.

17. An apparatus as set forth in claim 16, wherein said at least one heater device comprises a plurality of cartridge heaters.

18. An apparatus for controlling the temperature of an electronic device under test, said apparatus comprising:
- a refrigeration system including a compressor and a condenser, said refrigeration system being operative to circulate a refrigerant fluid through a fluid flow loop such that said refrigerant fluid will change between gaseous and liquid states so as to alternately absorb and release thermal energy;
- a thermal head having a temperature controlled surface movable into and out of engagement with said device under test, said thermal head defining a flow channel for passage of said refrigerant fluid to thereby function as an evaporator in said refrigeration system;
- at least one heater device operative to supply thermal energy to said thermal head;
- a metering valve located between said condenser and said evaporator in said fluid flow loop, said metering valve being operative to regulate introduction of said refrigerant fluid into said flow channel of said thermal head; and
- a controller operative to control said metering valve and said at least one heater device for maintaining a predetermined temperature at said temperature controlled surface.

19. An apparatus as set forth in claim 18, wherein said refrigeration system includes a capillary tube having a first end and a second end, said second end of said capillary tube being in fluid communication with an inlet of said flow channel of said thermal head.

20. An apparatus as set forth in claim 19, wherein said metering valve is located at said first end of said capillary tube.

21. An apparatus as set forth in claim 18, wherein said metering valve is a pulsing valve operated by a pulse width modulated (PWM) signal.

22. An apparatus as set forth of claim 18, wherein said controller is adapted to allow said predetermined temperature to be varied by a user.

23. An apparatus as set forth in claim 22, wherein said controller is a PID controller.

24. An apparatus as set forth in claim 18, wherein said at least one heater device comprises a plurality of cartridge heaters.

\* \* \* \* \*